(12) United States Patent
Maxim et al.

(10) Patent No.: US 6,828,864 B2
(45) Date of Patent: Dec. 7, 2004

(54) LOW-JITTER LOOP FILTER FOR A PHASE-LOCKED LOOP SYSTEM

(75) Inventors: Adrian Maxim, Austin, TX (US); Baker Scott, III, Boulder, CO (US); Edmund M. Schneider, Austin, TX (US); Melvin L. Hagge, Round Rock, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/612,200

(22) Filed: Jul. 3, 2003

(65) Prior Publication Data

US 2004/0095196 A1 May 20, 2004

Related U.S. Application Data

(63) Continuation of application No. 10/043,558, filed on Jan. 10, 2002, now Pat. No. 6,690,240.

(51) Int. Cl.[7] .............................................. H03L 7/00
(52) U.S. Cl. .................... 331/17; 331/36 C; 331/16; 327/156; 327/157
(58) Field of Search ................................ 331/36 C, 16, 331/17; 327/156, 159

(56) References Cited

U.S. PATENT DOCUMENTS

| | | | | |
|---|---|---|---|---|
| 6,229,361 B1 | * | 5/2001 | Henwood | 327/145 |
| 6,614,316 B2 | * | 9/2003 | Masenas et al. | 331/17 |
| 6,690,240 B2 | * | 2/2004 | Maxim et al. | 331/17 |

OTHER PUBLICATIONS

Young et al., A PLL Clock Generator with 5 to 110 MHz of Lock Range for Microprocessors, J. Solid–State Circuits, 27(11):1599–1607, Nov. 1992.

Maneatis, J.G., "Low–Jitter Process–Independent DLL an d PLL Base on Self–Biased Techniques," J. Solid–State Circuits, 31(11):1723–1732, Nov. 1996.

Mijuskovic et al., "Cell–Based Fully Integrated CMOS Frequency Synthesizers" J. Solid–State Circuits, 29(3):217–279, Mar. 1994.

Novof et al., "Fully Integrated CMOS Phase–Locked Loop with 15 to 240 MHz Locking Range and ±50 ps Jitter," J. Solid–State Circuits, 30(11):12592–12696, Nov. 1995.

Lee and Kim, "A Low–Noise Fast–Lock Phase–Locked Loop with Adaptive Bandwidth Control," J. Solid–State Circuits, 35(8):1137–1145, Aug. 2000.

Lin et al., "A 1.4GHz Differential Low–Noise CMOS Frequency Synthesizer Using a Wideband PLL Architecture," ISSCC Dig. Tech. Papers, San Francisco, CA, Feb. 2000, pp. 147–149.

(List continued on next page.)

*Primary Examiner*—Arnold Kinkead
(74) *Attorney, Agent, or Firm*—Steven Lin, Esq.

(57) ABSTRACT

A loop filter device and method for implementing a loop filter for a phase locked loop ("PLL") circuit, which locks a frequency of a signal to a reference frequency, are disclosed. The loop filter includes a proportional path circuit and an integral path circuit. The proportional path circuit receives a charge pump output and determines and holds a charge to be directed to or taken from a PLL circuit throughout an update period based on a detected phase difference for the update period for locking a frequency of a signal for a PLL circuit to a reference frequency. The integral path circuit is coupled to the proportional path circuit, and the integral path circuit receives another charge pump output and tracks a total charge level for the PLL circuit based on phase differences for present and prior update periods.

14 Claims, 9 Drawing Sheets

OTHER PUBLICATIONS

Rhee, W., "Design of High Performance CMOS Charge–Pumps In Phase–Locked Loops," Proc. IEEE Int. Symp. Circuits and Systems, Orlando, FL, May 1999, pp. II 545–II 549.

Maxim et al., "A Low Jitter 125–1250 MHz Process Independent 0.18$\mu$m CMOS PLL Based on a Sample–Recent Loop Filter," ISSCC Dig. Tech. Papers, San Francisco, CA, Feb. 2001, pp. 394–395.

Maxim & Maxim, "A Novel Physical Model of Deep–Submicron CMOS Transistors Mismatch for Monte Carlo SPICE Simulation," Proc. IEEE Int. Symp. Circuits and Systems, Sydney, NSW, Australia, May 2001, pp. V.511–V.514.

* cited by examiner

LOW-JITTER LOOP FILTER FOR A PHASE-LOCKED LOOP SYSTEM

This application is a continuation of U.S. patent application Ser. No. 10/043,558 filed Jan. 10, 2002, now U.S. Pat. No. 6,690,240.

BACKGROUND OF THE INVENTION

1. Field of the Invention

The present invention relates to phase-locked loop ("PLL") circuits, and, more particularly, to a loop filter for a PLL circuit. More specifically, the present invention relates to a low-jitter loop filter for a PLL circuit.

2. Description of Related Art

A phase-locked loop ("PLL") circuit generally includes a phase detector, a loop filter, and a controlled oscillator. The phase detector receives an input signal, which has a reference frequency. The output signal of the controlled oscillator is fed back to the phase detector. The frequency of the output signal is typically a multiple of the reference frequency of the input signal. The PLL circuit is utilized to lock the output frequency to the input frequency. Locking the output frequency to the input reference frequency is critical in various applications, such as developing accurate and precise clocks for digital signal processors ("DSPs") and for audio sampling frequencies and rates. Fast locking applications also exist in which adaptive bandwidth PLLs have been developed and used.

PLL circuits in mixed-signal integrated circuit designs typically operate in noisy environments. Much of the noise is introduced through the current or voltage supplies, the substrate, temperature variations, process parameters, or other such sources. Low jitter PLL circuits require high loop bandwidths to reject the noise.

Passive loop filters for PLL circuit designs are popular due to their simplicity, but the control of their loop time constants lacks flexibility. Active loop filters used in conjunction with feed-forward charge pumps provide a wider range of loop time constants and often provide a decreased area of on-chip capacitance. Fully differential charge pumps for PLL circuit designs have been of great interest due to their ability to reject noise. However, fully differential charge pumps require increased on-chip capacitance and extra circuitry for common mode feedback. One drawback of a charge pump PLL circuit is that setting the loop filter pole position requires a compromise between the loop phase margin and the jitter performance.

Typical charge pump PLL circuits having two poles at the origin require a zero to be introduced in the loop for stability. A common method of adding a zero is to couple a resistor in series with the charge pump capacitor or by using a feed-forward technique. Most charge pump PLLs use a proportional signal that is based on the instantaneous phase difference. The signal in lock is characterized by narrow high amplitude pulses, that even after filtering, lead to an abrupt variation of the oscillator control signal and rapid frequency changes that degrade the jitter performance of the PLL circuit.

With reference now to FIG. 1, an exemplary phase-locked loop ("PLL") circuit 100 according to the prior art is shown. PLL circuit 100 includes a phase frequency detector ("PFD") 104, a charge pump ("CP") 106, a loop filter 108, and a controlled oscillator ("CO") 116 coupled together in series. An N divider 102 is coupled to an input of the PFD 104. An M divider 118 is coupled to the output of the CO 116, and the output of M divider 118 is coupled and fed back to another input of the PFD 104. An input signal 101 is fed into N divider 102 and divides input signal 101 by a factor of N to provide input reference signal 103. The N-divided input reference signal 103 is fed as an input signal into PFD 104. Furthermore, an output signal 120 of PLL circuit 100 is fed into an M divider 118 as shown in FIG. 1. M divider 118 divides output signal 120 by a factor of M to provide an input feedback signal 105.

PFD 104 compares the frequencies or phases of input reference signal 103 and feedback signal 105. PFD 104 generates and outputs a phase error signal to CP 106. The phase error signal is the difference in phase between what the phase of the signal currently is (e.g., phase of feedback signal 105) and what the phase of the signal should be (e.g., phase of the input reference signal 103). The phase error signal may be passed onto loop filter 108 in terms of a current value (e.g., charge stream) from CP 106. Loop filter 108 filters currents from CP 106 by passing some current signals at certain frequencies while attenuating other current signals at other frequencies. Loop filter 108 provides and outputs a control signal to tune the phase of the output signal 120 based on any difference between the control signal and a normal operating or optimum signal. The control signal is input into CO 116 to provide an output phase for output signal 120 that the loop will lock with the reference phase of input reference frequency 101.

Loop filter 108, which is an exemplary loop filter according to the prior art, has a proportional signal path 107 and an integral signal path 109. Proportional signal path 107 includes a resistor 110 having one node coupled to the output of CP 106 and the other node coupled in series to a node of a proportional path capacitor 112. The other node of proportional path capacitor 112 is coupled to ground. Integral signal path 109 includes an integral path capacitor 114. One node of integral path capacitor 114 is also coupled to the output of CP 106, and the other node of integral path capacitor 114 is coupled to ground. Proportional signal path 107 generates a proportional signal that is based on the instantaneous phase difference. Integral signal path 109 provides an integral signal, which tracks the overall input signal level that includes past proportional input signals. Loop filter 108 generates and outputs the control signal, which is the sum of the present proportional signal with the overall signal level, to CO 116. CO 116, in turn, generates output signal 120 having an output phase that the loop will lock with the reference phase of input reference frequency 103.

Referring now to FIG. 2, an exemplary graph 200 showing ideal signals or pulses 206, 208, and 210 generated by proportional path 107 of loop filter 108 according to the prior art is depicted. In exemplary graph 200, proportional path signal 202 is plotted against time 204. When PFD 104 of PLL circuit 100 detects instantaneous phase differences, proportional path 107 of loop filter 108 outputs pulses 206, 208, and 210 to CO 116. Pulses 206, 208, and 210 vary in width based on the magnitudes of the detected phase differences (e.g., from larger to smaller pulses based on respective larger to smaller magnitudes of phase differences). As shown in FIG. 2, pulses 206, 208, and 210 occur in the early portions of update periods ("Tupdates") 205. The signal levels then return to a zero level for the remaining portions of Tupdates 205.

As stated earlier, pulses 206, 208, and 210 based on instantaneous phase differences lead to abrupt variations of the signal of CO 116 and rapid frequency changes that degrade the jitter performance of PLL circuit 100. With reference now to FIG. 3, an exemplary graph 300 illustrating the input signal to CO 116 from loop filter 108 according to the prior art is depicted. In exemplary graph 300, CO input signal 302 is plotted against time 304. Exemplary graph 300 shows integral path signal 308 plotted against time 304. Integral path signal 308 only sums the past pulses but is not substantially affected by any single pulse 206, 208, or 210 of proportional path 107. Exemplary graph 300 further shows proportional path signal 310 and the total CO input signal 306 having waveforms with jitter that is attributed to pulses similar to pulses 206, 208, and 210 of proportional path 107. The jitter occurs both in the unlocked and locked periods of PLL circuit 100. As shown in FIG. 3, the pulses therefore negatively affect the overall jitter performance of PLL circuit 100.

It is well known in the art that signals for a PLL circuit can be either voltage signals or current signals. Conversion between the voltage and current domains can be performed. Therefore, a PLL circuit could be described as a system having either a respective voltage or current mode filter and either a respective voltage or current controlled oscillator.

The present invention recognizes the desire and need for reducing the jitter in a PLL circuit. The present invention further recognizes the desire and need to eliminate or minimize the effects of the current pulses generated by the proportional path of a PLL loop filter. The present invention also recognizes the desire and need not to compromise loop phase margin for a PLL circuit and to provide and maintain stability for a PLL circuit. The present invention overcomes the problems and disadvantages in accordance with the prior art.

SUMMARY OF THE INVENTION

A loop filter device and method for a phase locked loop ("PLL") circuit, which locks a frequency of a signal to a reference frequency, are disclosed. The loop filter includes a proportional path circuit and an integral path circuit. The proportional path circuit receives a charge pump output and determines and holds a charge to be directed to or taken from the PLL circuit throughout an update period based on a detected phase difference for the update period for locking a frequency of a signal for the PLL circuit to a reference frequency. The integral path circuit is coupled to the proportional path circuit, and the integral path circuit receives another charge pump output and tracks a total charge level for the PLL circuit based on phase differences for present and prior update periods.

An object and advantage of the present invention is to provide a loop filter having an integral path circuit and a proportional path circuit, which receives a charge pump output and determines and holds a charge to be directed to or taken from the PLL circuit throughout an update period based on a detected phase difference for the update period for locking a frequency of a signal for the PLL circuit to a reference frequency.

An aspect and advantage of the present invention is to provide the loop filter device and method in which a transconductance stage of the proportional path circuit receives as an input the charge pump output for converting a voltage signal based on the signal for the PLL circuit to a current signal. A capacitor is coupled between the input of the transconductance stage and a reset voltage level. The capacitor is able to be charged to hold the charge and to be reset by discharging to the reset voltage level. Another capacitor is coupled between the input of the transconductance stage and the reset voltage level. The other capacitor is also able to be charged to hold the charge and to be reset by discharging to the reset voltage level.

Another aspect and advantage of the present invention is to provide the loop filter device and method in which the proportional path circuit activates a hold switch to couple the capacitor to one charge pump. The proportional path circuit activates a reset switch to couple the capacitor to a reset voltage source to set the capacitor to the reset voltage level and activates another hold switch to couple the other capacitor to the one charge pump. The proportional path circuit activates another reset switch to couple the other capacitor to the reset voltage source to set the other capacitor to the reset voltage level.

A further aspect and advantage of the present invention is to provide the loop filter to which a phase detector that measures the phase difference and controls activation and deactivation of the hold switch, the reset switch, the other hold switch, and the other reset switch to charge, hold, and reset the capacitor and the other capacitor at appropriate times.

A still further aspect and advantage of the present invention is to provide the loop filter device and method in which the charge of the capacitor is reset. The phase frequency detector detects a beginning edge of the phase difference and deactivates the hold switch and the reset switch to couple the capacitor to the one charge pump to set the capacitor with the charge. The phase frequency detector detects a finishing edge of the phase difference. The phase frequency detector activates the hold switch to hold the capacitor with the charge and maintains the reset switch as deactivated so that the capacitor is coupled between the input of the transconductance stage and the reset voltage level. The phase frequency detector further deactivates another hold switch and activates another reset switch to couple the other capacitor to the reset voltage source to set another capacitor to the reset voltage level and to uncouple the other capacitor from the one charge pump. The phase frequency detector maintains the charge of the capacitor until the phase frequency detector detects a next phase difference.

Still another aspect and advantage of the present invention is to provide the loop filter device and method in which the phase frequency detector detects a beginning edge of the next phase difference. The phase frequency detector maintains the other hold switch as deactivated and deactivates the other reset switch to couple the other capacitor to the one charge pump to set the other capacitor with the charge. The phase frequency detector detects a finishing edge of the next phase difference and activates the other hold switch to hold the other capacitor with the charge. The phase frequency detector maintains the other reset switch as deactivated so that the other capacitor is coupled between the input of the transconductance stage and the reset voltage level. The phase frequency detector further deactivates the hold switch and activates the reset switch to couple the capacitor to the reset voltage source to set the capacitor to the discharged voltage level and to uncouple the capacitor from the one charge pump. The phase frequency detector maintains the charge of the other capacitor until the phase frequency detector detects a following phase difference.

A further aspect and advantage of the present invention is to provide the loop filter device and method in which the phase frequency detector repeats the operations of charging, holding, and resetting of the capacitor and the other capacitor for future phase differences detected by the phase frequency detector.

Another object and advantage of the present invention is to provide a phase-locked loop circuit and method for locking a frequency of a signal to a reference frequency which includes, incorporates, and implements the above-referenced loop filter. The PLL circuit has a phase frequency detector, the above-indicated loop filter, a current adder, and a current-controlled oscillator coupled together in series. The phase frequency detector receives as input signals a reference frequency signal and a fed back output signal of the current-controlled oscillator.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 4:
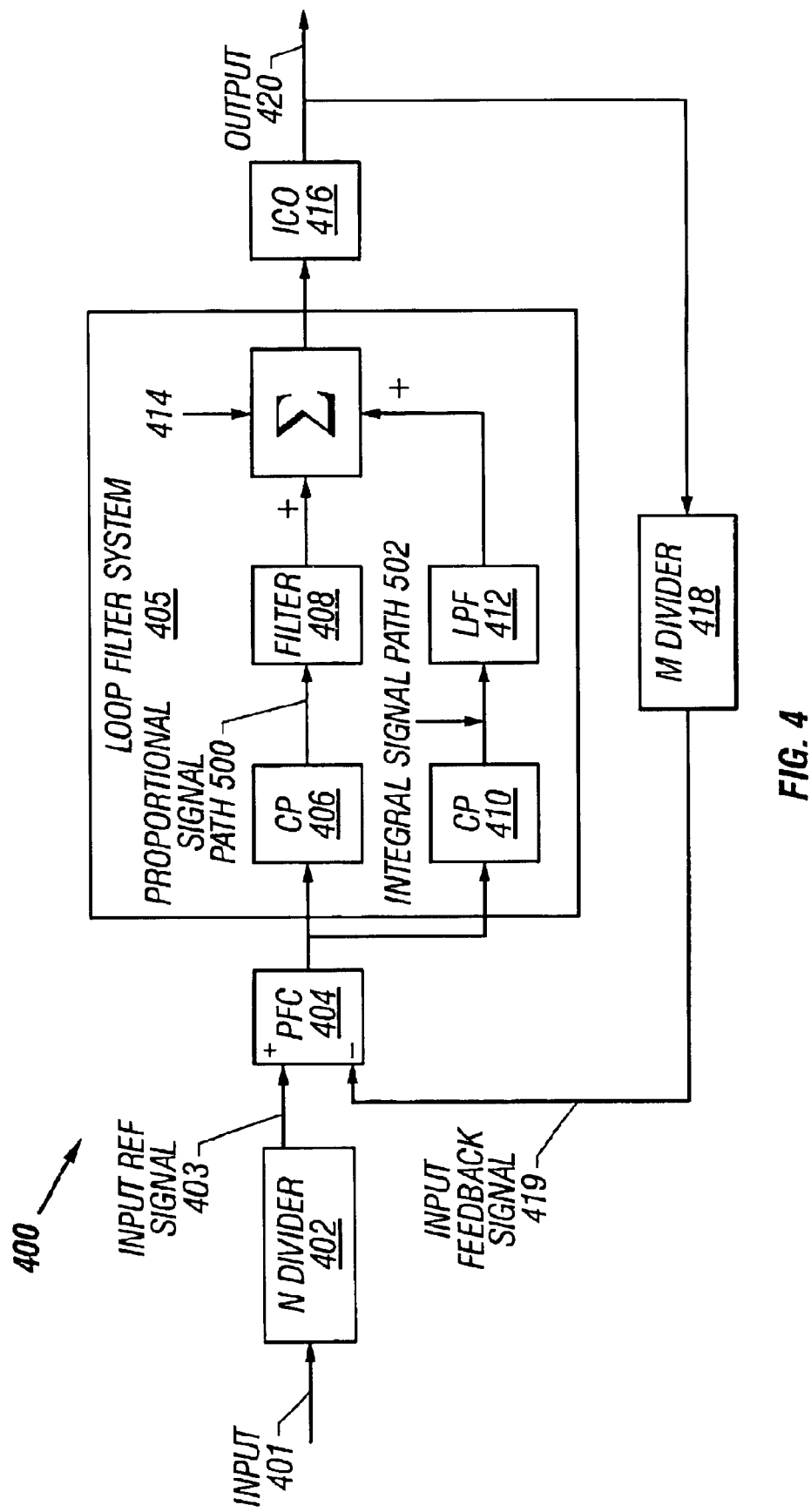
FIG. 4 is an exemplary block diagram of a phase-locked loop circuit having a loop filter system according to the present invention.

With reference now to FIG. 4, an exemplary phase-locked loop ("PLL") circuit 400 according to the present invention is shown. PLL circuit 400 includes a phase frequency comparator ("PFC") 404, a loop filter system 405 that includes a current adder ("σ") 414, and a current controlled oscillator ("ICO") 416 coupled together in series. An N divider 402 is coupled to a positive input node of PFC 404. An M divider 418 is coupled to the output of ICO 416, and the output of M divider 418 is coupled and fed back to a negative input node of PFC 404. An input signal 401 is fed into N divider 402 and divides input signal 401 by a factor of N to provide input reference signal 403. The N-divided input reference signal 403 is fed as an input signal into PFC 404. Furthermore, an output signal 420 of PLL circuit 400 is fed into an M divider 418 as shown in FIG. 4. M divider 418 divides output signal 420 by a factor of M to provide an input feedback signal 419. The M-divided input feedback signal 419 is fed back as an input signal into the negative input node of PFC 404.

Loop filter system 405 has a proportional signal path 500 and an integral signal path 502. Proportional signal path 500 includes a charge pump ("CP") 406 coupled in series with a loop filter device ("filter") 408. The output of PFC 404 is coupled to the input of CP 406, and the output of CP 406 is coupled to the input of filter 408. The output of filter 408 is then fed into current adder 414. Integral signal path 502 has another charge pump ("CP") 410 coupled in series with another loop filter device ("LPF") 412. The output of PFC 404 is coupled to the input of CP 410, and the output of CP 410 is coupled to the input of LPF 412. The output of LPF 412, in turn, is fed into current adder 414.

As shown in FIG. 4, loop filter system 405 has proportional signal path 500 and integral signal path 502 each driven by its own independent charge pump source, CP 406 and 410. CP 406 may be supplied from an independent charge pump while CP 410 may be supplied from another independent charge pump. Alternatively, CP 406 and 410 may be provided as independent charge pump sources from a single charge pump. However, in this alternative charge-pump embodiment, CP 406 is supplied from a predetermined/fixed, scaled charge output of the single charge pump while CP 410 is supplied from another predetermined/fixed, scaled charge output of the single charge pump. In this case, the charge output from the single charge pump for each of CP 406 and 410 does not vary and is fixed. The present invention therefore provides a loop filter system 405 with independent charge pump outputs, which are fixed charge amounts to the proportional and integral signal paths.

PFC 404 compares the frequencies or phases of input reference signal 403 and feedback signal 419. PFC 404 generates and outputs a phase error signal based on the comparison and phase differences of the frequencies or phases. The phase error signal is fed into loop filter system 405. The phase error signal is the difference in phase between what the phase of the signal currently is (e.g., phase of feedback signal 419) and what the phase of the signal should be (e.g., phase of the input reference signal 403).

The phase error signal is passed to CP 406 of proportional signal path 500. CP 406 generates a current value (e.g., charge stream) based on the phase error signal. Filter 408 filters currents from CP 406 by passing some currents at certain frequencies while attenuating other currents at other frequencies. Proportional signal path 500 generates a proportional current signal that is based on the instantaneous phase error signal. Integral signal path 502 creates a weighed sum or integral over all past and present outputs from charge pump 406. Thus, the integral path current output includes memory of phase error signals for various prior update periods as well as a component attributed to the present update. The overall current from the integral signal path 502 and the proportional current signal from proportional signal path 500 are fed as inputs into current adder 414. Current adder 414 adds the overall current level and the proportional current signal together to output a control current that tunes the phase of output signal 420 based on the control current. The control current is input into ICO 416 to provide an output signal 420 having an output phase that the loop feedback will lock in phase with the reference phase of input reference frequency 401.

Figure 5:
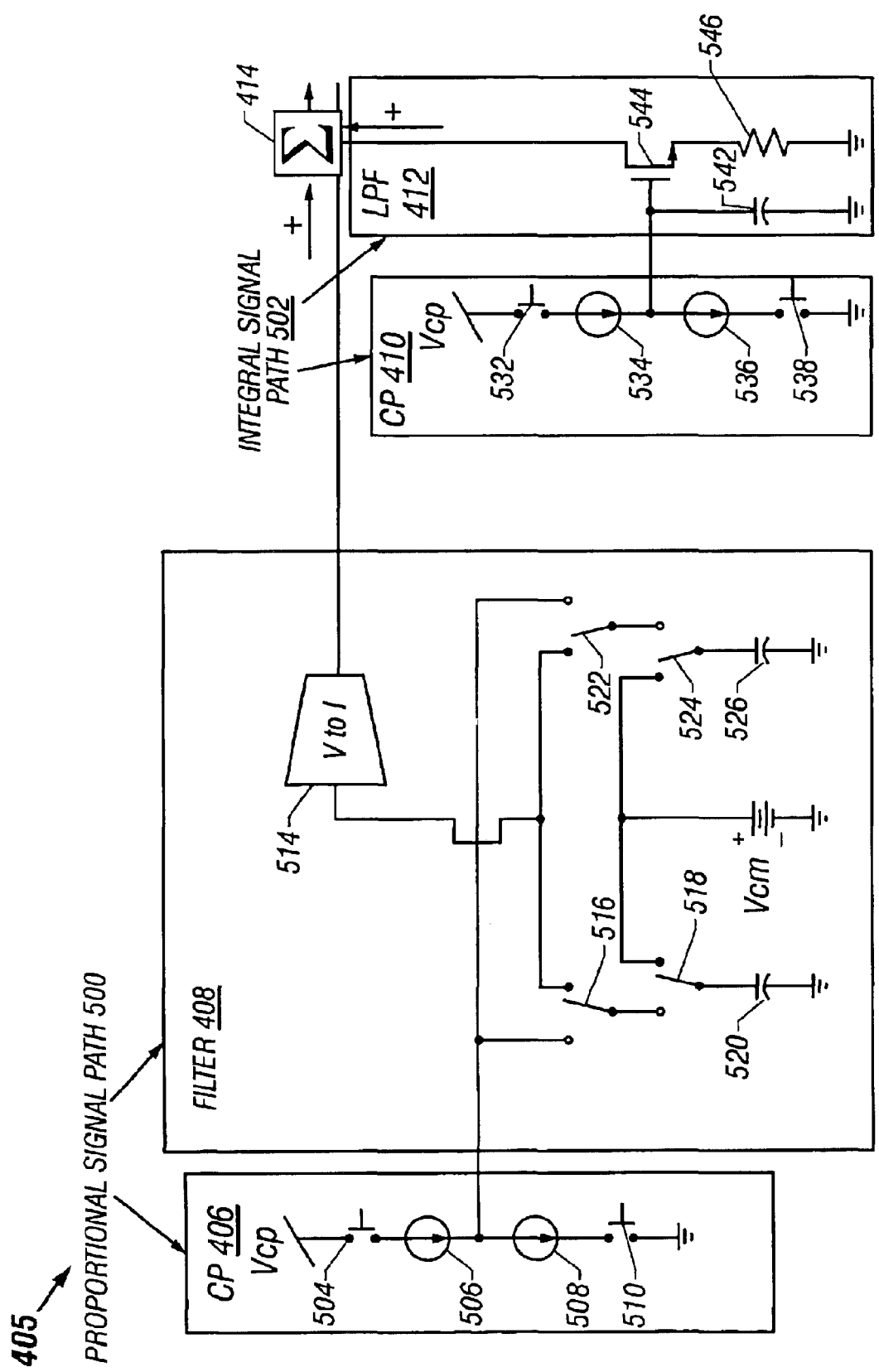
FIG. 5 is an exemplary circuit block diagram of the loop filter system of FIG. 4 according to the present invention.

Referring now to FIG. 5, an exemplary circuit block diagram of loop filter system 405 of FIG. 4 according to the present invention is illustrated. FIG. 5 shows loop filter system 405 with proportional signal path 500 and integral signal path 502. As stated earlier, proportional signal path 500 has CP 406 and filter 408. In FIG. 5, CP 406 has a current activating switch 504, a current source 506, another current source 508, and another current activating switch 510 coupled between a voltage source Vcp and ground in the manner shown in FIG. 5. Current activating switch 504 controls current source 506, and current activating switch 510 controls current source 508. Current sources 506 and 508 are controlled by switches 504 and 510 in a way that provides the appropriate charge amounts or levels from CP 406.

Filter 408 includes a transconductance ("V-to-I") stage 514, which receives its input from either switch 516 or 522. V-to-I stage 514 converts a voltage signal based on the input reference signal 403 of FIG. 4 to a current signal. Filter 408 further has a capacitor 520 and another capacitor 526. Capacitor 520 is able to couple to the output signal of CP 406 to charge up and hold the appropriate charge based on the phase error signal. Capacitor 520 is also able to couple in parallel to reset voltage Vcm and reset to the reset voltage level Vcm. The other capacitor 526 is further able to couple to the output signal of CP 406 to charge up and hold the appropriate charge based on the phase error signal. The other capacitor 526 is also able to couple in parallel to reset voltage Vcm and reset to the reset voltage level Vcm.

Figure 7A:
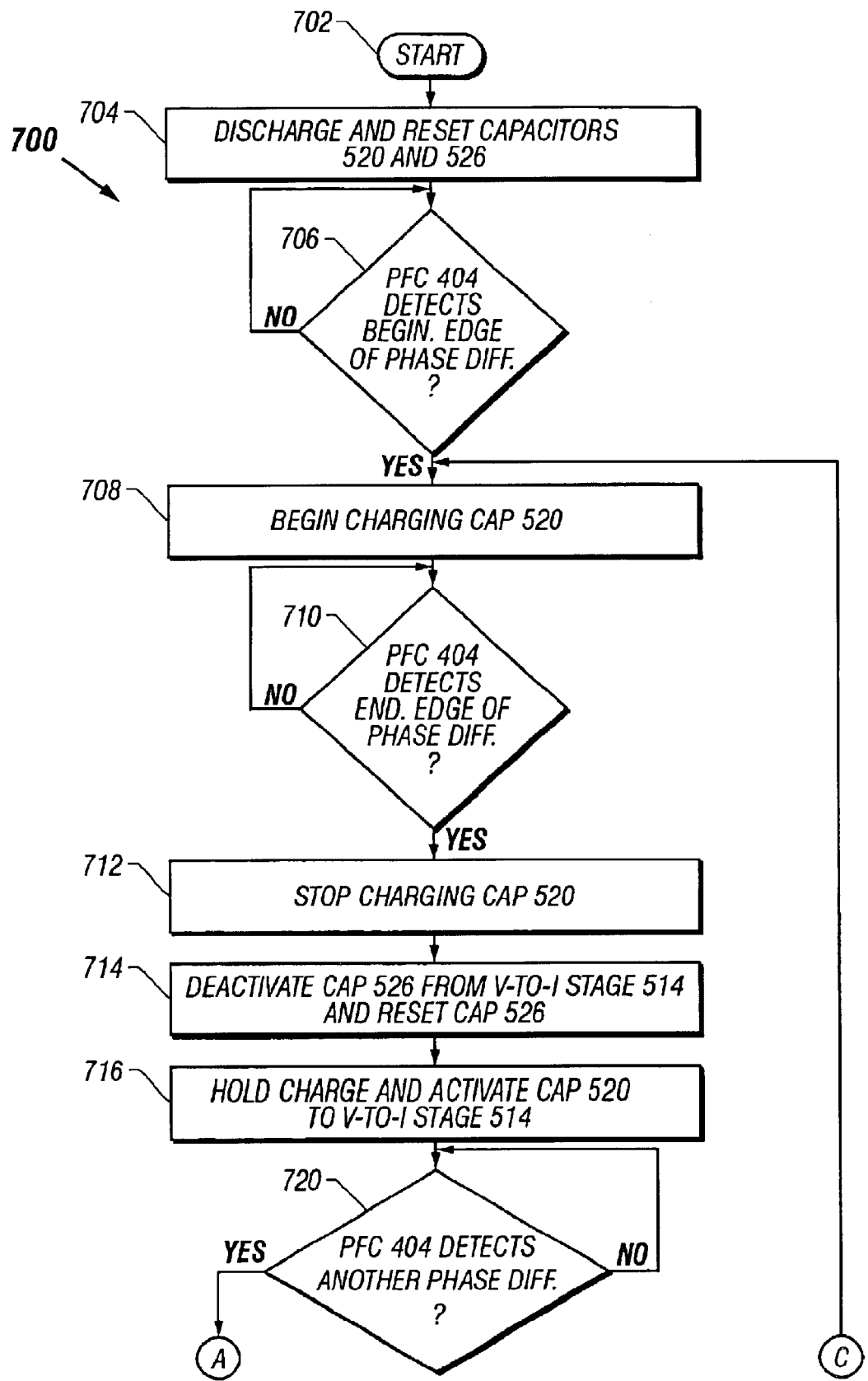
FIGS. 7A and 7B are a flow chart diagram of an exemplary method for controlling the operations of the loop filter system of FIGS. 4 and 5.
Figure 7B:
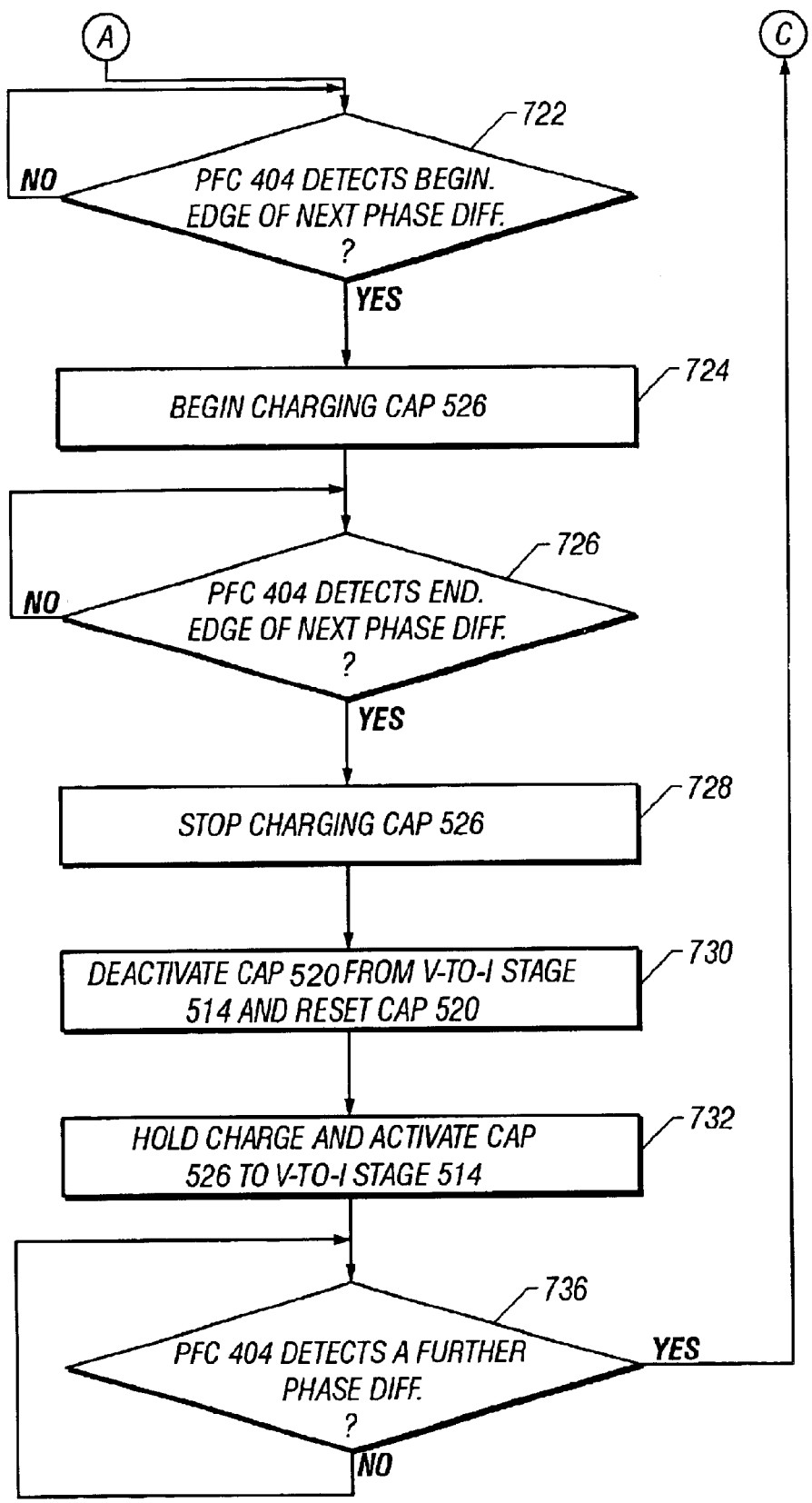

A hold switch 516 is activated to couple capacitor 520 to V-to-I stage 514. A reset switch 518 is activated to couple capacitor 520 in parallel with reset voltage source Vcm. Furthermore, another hold switch 522 is activated to couple capacitor 526 to V-to-I stage 514. Another reset switch 524 is activated to couple capacitor 526 to reset voltage source Vcm. As stated earlier, PFC 404 detects a phase difference between input reference signal 403 and input feedback signal 419. PFC 404 controls activation and deactivation of hold switches 516 and 522 and reset switches 518 and 524 to respectively charge, hold, and reset capacitors 520 and 526 at the appropriate times. An exemplary algorithm for controlling these loop operations will be discussed later when the details of FIGS. 7A and 7B are discussed. Capacitors 520 and 526 are able to couple to an output voltage of CP 406 or reset voltage level Vcm as shown in FIG. 5 depending on the activation and/or deactivation of hold switches 516 and 522 and reset switches 518 and 524.

Also, as stated earlier, integral signal path 502 has CP 410 and LPF 412. In FIG. 5, CP 410 has a current activating switch 532, a current source 534, another current source 536 and another current activating switch 538 coupled between a voltage source Vcp and ground in the manner shown in FIG. 5. Current activating switch 532 controls current source 534, and current activating switch 538 controls current source 536. Current sources 534 and 536 are controlled by switches 532 and 538 in a way that provides the appropriate charge amounts or levels from CP 410.

LPF 412 includes a capacitor 542, a transistor 544, and a resistor 546 coupled in the manner shown in FIG. 5. Capacitor 542 is coupled between the gate of transistor 544 and ground. The gate of transistor 544 couples to the output of CP 410. Resistor 546 is coupled between the source of transistor 544 and ground. The output of V-to-I stage 514 is coupled to an input of current adder 414, and the drain of transistor 544 is coupled to another input of current adder 414. LPF 412 with capacitor 542, transistor 544, and resistor 546 acts as an integrator by adding the current value based on the phase error generated by CP 410.

Figure 6:
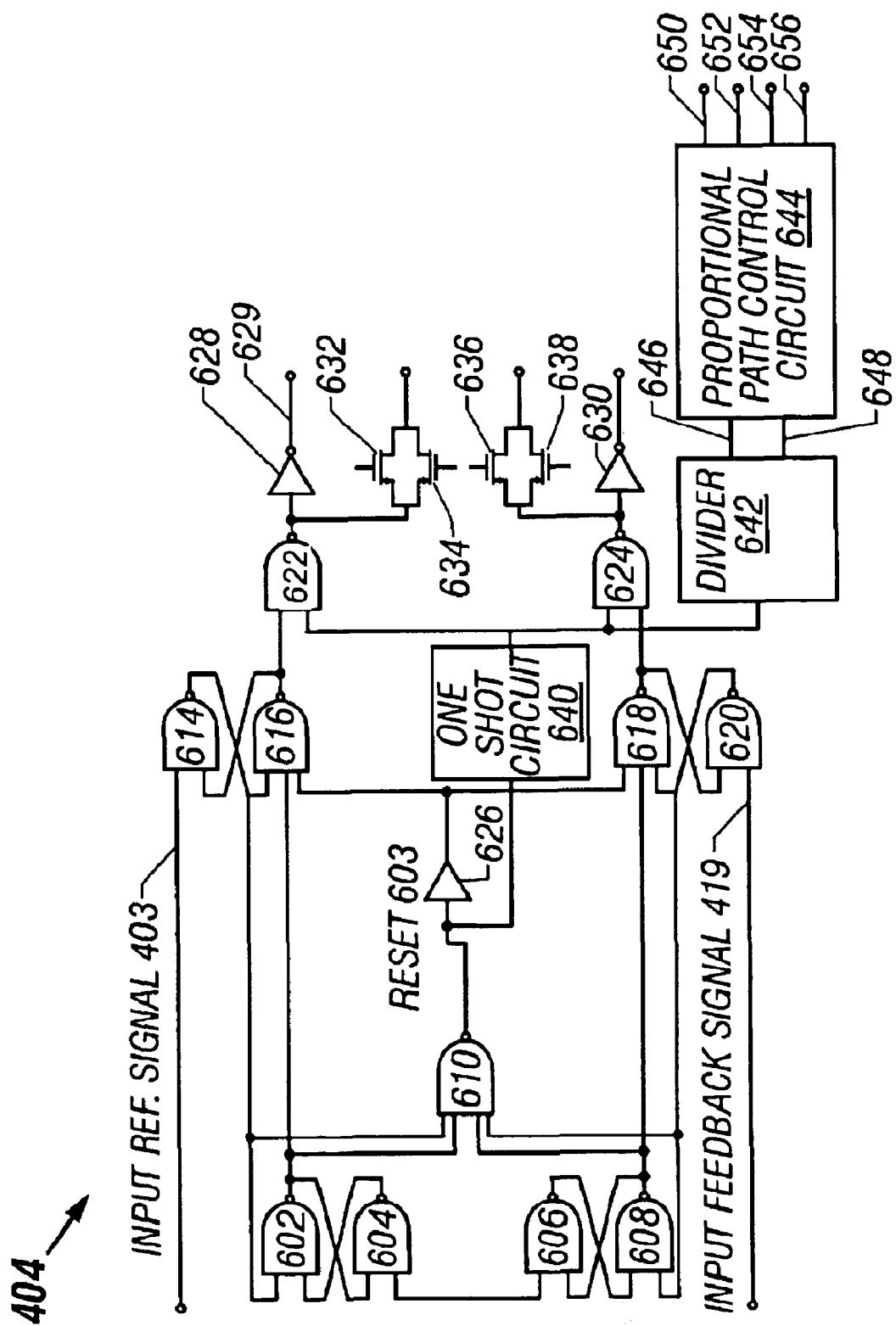
FIG. 6 is an exemplary circuit diagram of the phase frequency comparator ("PFC") in FIG. 4 according to the present invention.

With reference now to FIG. 6, an exemplary phase frequency comparator ("PFC") 404 of FIG. 4 according to the present invention is shown. PFC 404 utilizes an NAND gate architecture. PFC 404 has NAND gates 602, 604, 606, 608, 610, 612, 614, 616, 618, 620, 622, and 624 coupled in the manner shown in FIG. 6. Input reference signal 403 is fed into PFC 404 at an input terminal of NAND gate 614 while input feedback signal 419 is fed into PFC 404 at an input terminal of NAND gate 620.

A reset signal 603 is output from NAND gate 610. An inverter 626 is coupled to the output of NAND gate 610. The output of NAND gate 610 is also fed into a one shot circuit 640. The one shot circuit 640 is triggered by reset signal 603. The output of the one shot circuit 640 is coupled to the inputs of NAND gates 622 and 624. A divider 642, which divides by a factor of two, is coupled to the inputs of NAND gates 622 and 624 as shown in FIG. 6.

A proportional path control circuit 644 is coupled to divider 642 through two capacitor control lines 646 and 648, which are utilized to respectively control the charging of capacitors 520 and 526 of proportional signal path 500. Proportional path control circuit 644 has a hold control line 650 that is activated to hold the charge of capacitor 520 and a reset control line 652 that is activated to reset capacitor 520. Proportional path control circuit 644 also has a hold control line 654 that is activated to hold the charge of capacitor 526 and a reset control line 656 that is activated to reset the charge of capacitor 526.

An inverter 628 is coupled to the output of NAND gate 622, and another inverter 630 is coupled to the output of NAND gate 624. Transistors 632 and 634, which act as one pass gate, are coupled to the input of inverter 628, and transistors 636 and 638, which act as another pass gate, are coupled to the input of inverter 630. Pass gates formed by transistors 632, 634 and 636, 638 are added to the inputs of inverters 628 and 630 to match the propagation time of inverters 628 and 630. Inverter 628 outputs a pump-up charge signal 629 while inverter 630 generates a pump-down charge signal 631. PFC 404 generates two synchronous narrow pulses for each update period for both pump-up and pump-down charge signals 629 and 631. The generation of two synchronous narrow pulses for each update period eliminates the dead-zone at small phase differences.

PFC 404 also generates control signals for hold switches 516 and 522 and reset switches 518 and 524 to select between charging, holding, and resetting capacitors 520 and 526. A flag for alternating between the update periods of capacitors 520 and 526 is generated by the one shot circuit 640 to divide the dead-zone avoidance in two. The control signals are non-overlapping signals that connect capacitors 520 and 526 alternately to CP 406 and V-to-I stage 514.

Referring now to FIGS. 7A and 7B, a flow chart diagram of an exemplary method 700 for controlling the operations of loop filter system 405 of FIGS. 4 and 5 is illustrated. Method 700 starts at block 702 and proceeds to block 704, which shows capacitors 520 and 526 of proportional signal path 500 being initially discharged and reset. Capacitors 520 and 526 are reset by activating both reset switches 518 and 524. Method 700 then proceeds from block 704 to decision block 706. Decision block 706 depicts PFC 404 determining whether a beginning edge of a phase difference has been detected. If PFC 404 has not detected a beginning edge of a phase difference, then method 700 iterates at decision block 706 until PFC 404 does detect such a beginning edge. However, if PFC 404 has detected a beginning edge of a phase difference, method 700 moves from decision block 706 to block 708. Block 708 illustrates capacitor 520 beginning to be charged. The charging of capacitor 520 is initiated by deactivating both hold switch 516 and reset switch 518. As shown in FIG. 5, the deactivation of both hold switch 516 and reset switch 518 couples capacitor 520 to CP 406. Based on the detected phase difference, CP 406, in turn, pumps the appropriate current or charge stream to capacitor 520.

After block 708, decision block 710 depicts PFC 404 determining whether an ending edge of the phase difference has been detected. If such an ending edge has not been detected, method 700 iterates at decision block 710. Capacitor 520 stays coupled to CP 406 and continues to be charged by CP 406. On the other hand, if an ending edge of the phase difference has been detected at decision block 710, then method 700 proceeds from decision block 710 to block 712. Block 712 reflects the stopping of the charge of capacitor 520. Referring back to FIG. 5, the charging of capacitor 520 is stopped by the activation of hold switch 516. Following block 712, block 714 represents capacitor 526 being deactivated from V-to-I stage 514 by deactivating the other hold switch 522. Block 714 further shows capacitor 526 being reset by activating the other reset switch 524, which couples reset voltage Vcm in parallel with capacitor 526. Method 700 then moves from block 714 to block 716, which indicates the charge of capacitor 520 being held and capacitor 520 being activated and coupled to V-to-I stage 514 by deactivating reset switch 518 (e.g., hold switch 516 is still in the activated position).

Method 700 then proceeds from block 716 to decision block 720, which depicts PFC 404 determining whether another phase difference has been detected. If PFC 404 does not detect another phase difference at decision block 720, then method 700 iterates at decision block 720 untl PFC 720 detects another phase difference. However, if PFC 404 does detect another phase difference at decision block 720, then method 700 next proceeds from decision block 720 to decision block 722 via connector A. Decision block 722 represents PFC 404 determining whether a beginning edge of a next phase difference has been detected. If such another beginning edge is not detected at decision block 722, then method 700 iterates thereat until such another beginning edge is detected. Once another beginning edge of a next phase difference is detected at decision block 722, method 700 proceeds to block 724, which shows capacitor 526 beginning to be charged. Referring again to FIG. 5, the charging of capacitor 526 is initiated by deactivating both hold switch 522 and reset switch 524. Deactivation of both hold switch 522 and reset switch 524 couples capacitor 526 to CP 406. Based on the detected phase difference, CP 406, in turn, pumps the appropriate current or charge stream to capacitor 526.

Following block 724, decision block 726 indicates PFC 404 determining whether an ending edge of the next phase difference has been detected. If such an ending edge has not been detected, method 700 iterates at decision block 726. Capacitor 526 stays coupled to CP 406 and continues to be charged by CP 406. On the other hand, if an ending edge of the phase difference has been detected at decision block 726, then method 700 proceeds from decision block 726 to block 728. Block 728 reflects the stopping of the charge of capacitor 526. The charging of capacitor 526 is stopped by the activation of hold switch 522. Following block 728, block 730 represents capacitor 520 being deactivated from V-to-l stage 514 by deactivating the hold switch 516. Block 730 further shows capacitor 520 being reset by activating the reset switch 518, which couples reset voltage Vcm in parallel with capacitor 520. Method 700 then moves from block 730 to block 732, which indicates the charge of capacitor 526 being held and capacitor 526 being activated and coupled to V-to-I stage 514 by deactivating reset switch 524 (e.g., hold switch 522 is still in the activated position).

Method 700 then proceeds from block 732 to decision block 736, which depicts PFC 404 determining whether a further phase difference has been detected. If PFC 404 does not detect a further phase difference at decision block 736, then method 700 iterates at decision block 736 until PFC 404 detects a further phase difference. However, if PFC 404 does detect a further phase difference at decision block 736, then method 700 loops back to decision block 708 via connector C and repeats the process by continuing therefrom.

Figure 1:
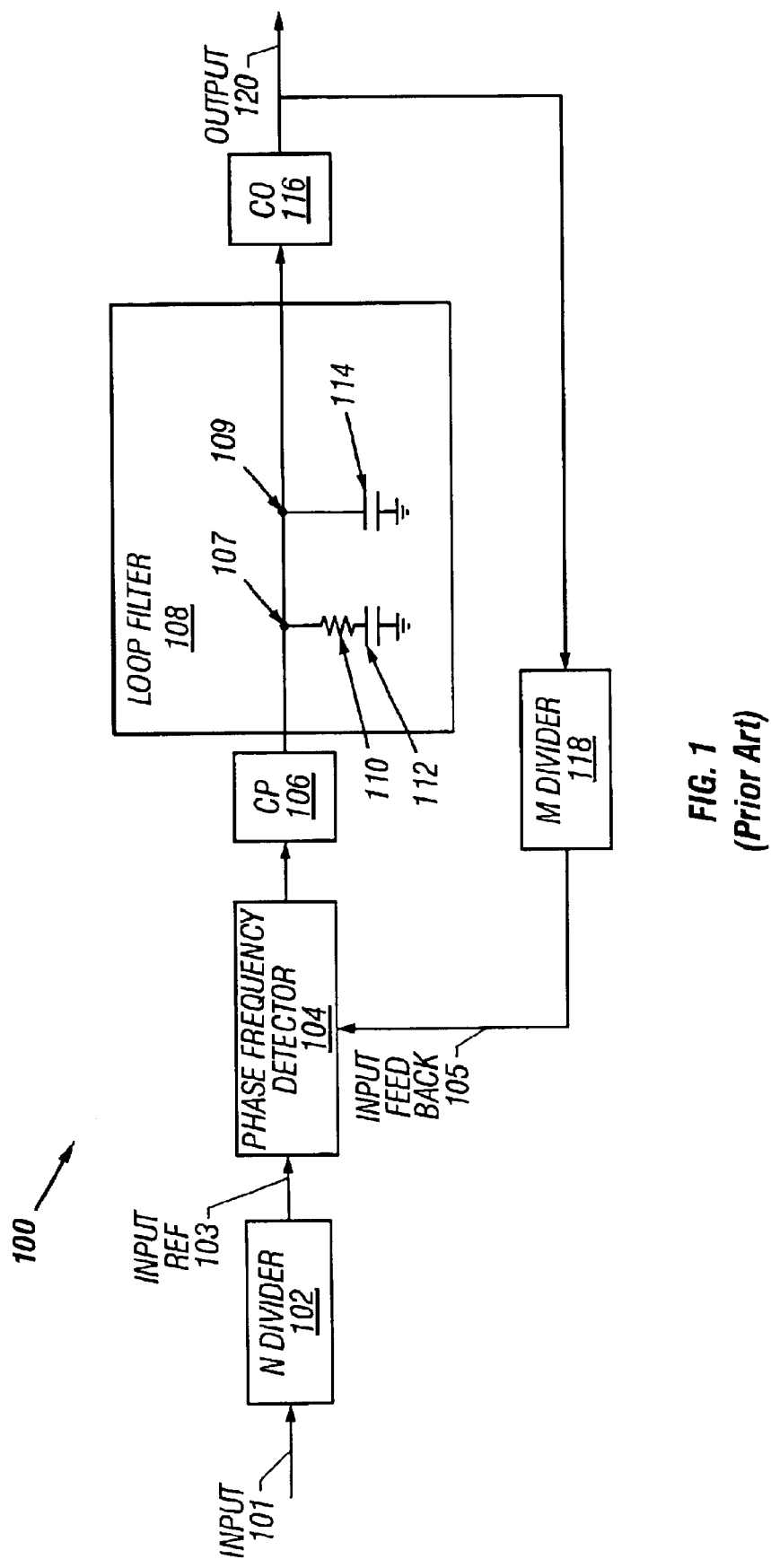
FIG. 1 is an exemplary block diagram of a phase-locked loop circuit having a loop filter according to the prior art.
Figure 2:
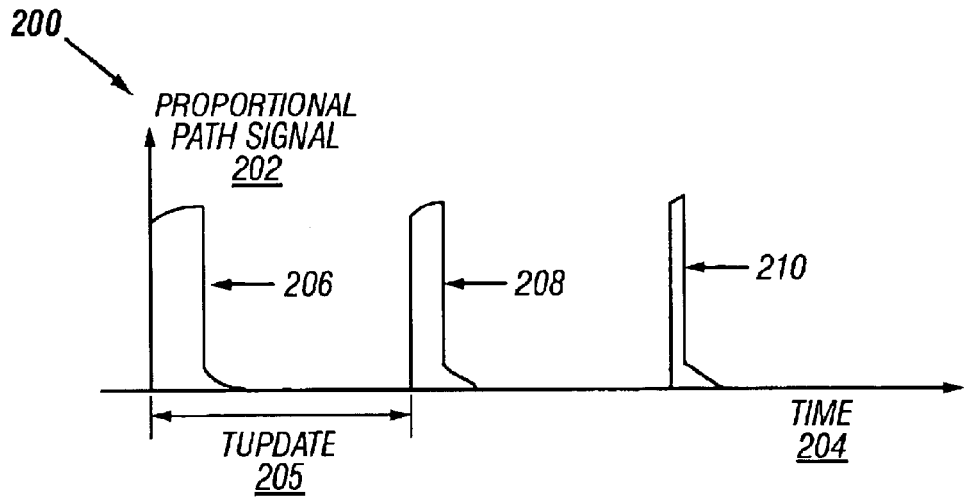
FIG. 2 is an exemplary graph showing signals generated by the proportional path for the loop filter of FIG. 1 according to the prior art.
Figure 3:
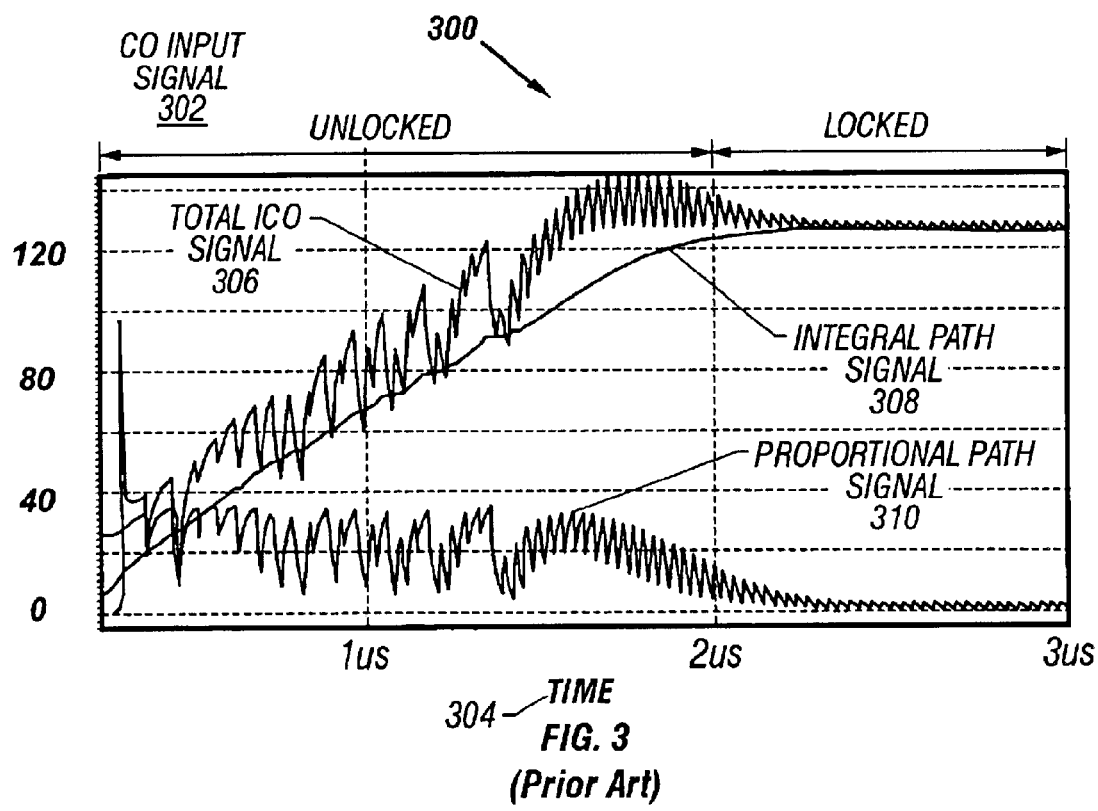
FIG. 3 is an exemplary graph illustrating the input signal to the controlled oscillator from the loop filter of FIG. 1 according to the prior art.
Figure 8A:
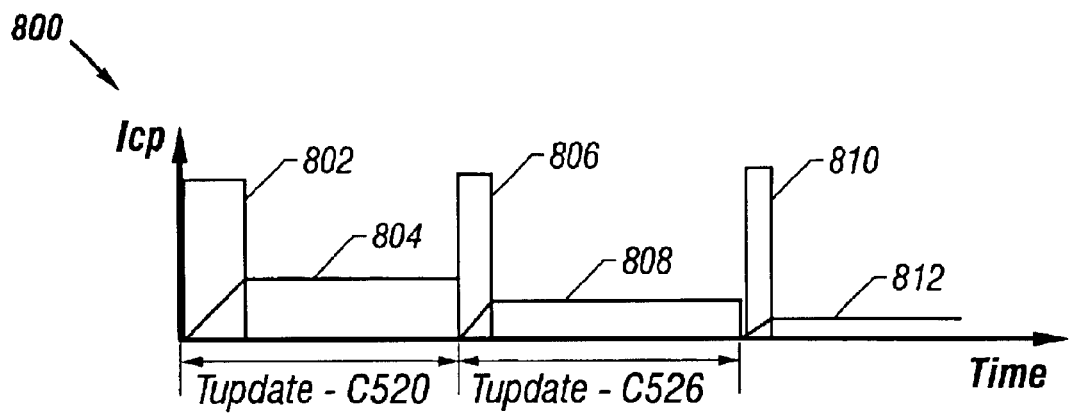
FIG. 8A is an exemplary timing graph showing current signals generated by the proportional signal path for the loop filter system of FIG. 4 according to the present invention in comparison with the proportional path for the loop filter of FIG. 1 according to the prior art.

With reference now to FIG. 8A, an exemplary timing graph 800 is illustrated. Timing graph 800 shows total current signal Icp generated by proportional signal path 500 for loop filter system 405 of FIG. 4 graphed against Time. Current pulses 802, 806, and 810 are generated by a proportional path system according to the prior art, such as shown in FIG. 1. Current pulses 802, 806, and 810 provided by a loop filter system according to the prior art are abrupt pulses that occur at the beginning of the Tupdate periods as shown in FIG. 8A. The abrupt pulses 802, 806, and 810 generally cause a jittery output current signal ICO from a current controlled oscillator ("ICO") according to the prior art (see prior art FIG. 3).

According to the present invention, loop filter system 405 provides a control current based on the phase difference over each entire Tupdate period. In effect, loop filter system 405 according to the present invention eliminates the abrupt current pulses 802, 806, and 810 and thus reduces the jitter in the overall ICO output current signal by spreading the charge of current pulses 802, 806, and 810 over the entire Tupdate periods. Current amounts 804, 808, and 812, which are the current pulses 802, 806, and 810 spread over the respective entire Tupdate periods, are the currents provided by proportional signal path 500 of loop filter system 405 according to the present invention. The amount of current (and charge) in current pulses 802, 806, and 810 are therefore respectively equal to the current amounts 804, 808, and 812 spread over the Tupdate periods.

Figure 8B:
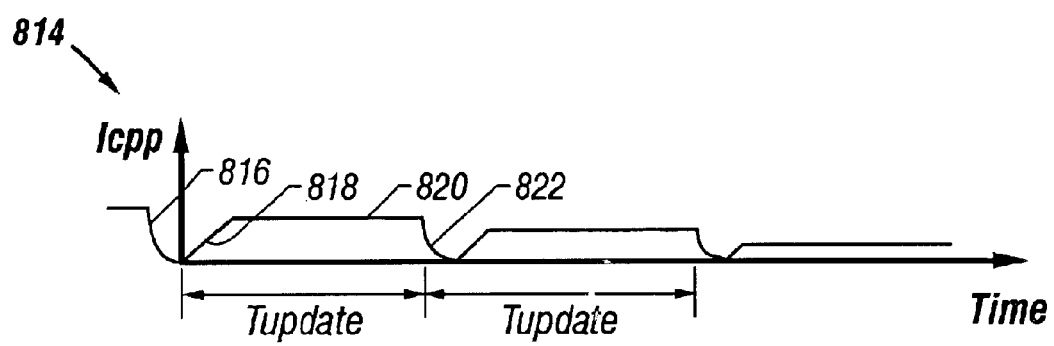
FIG. 8B is an exemplary timing graph showing the charging and discharging of current for a single capacitor of a proportional signal path for a loop filter system according to the present invention.

Referring now to FIG. 8B, an exemplary timing graph 814 showing the charging and discharging of current Icpp for a single capacitor proportional signal path 500 for loop filter system 405 is shown graphed against Time. The single capacitor is initially discharged to the zero current level as shown in area 816 of graph 814. To generate the charge amount 804 in graph 800 of FIG. 8A, the single capacitor is charged as shown in portion of plot 818, and the charge of the single capacitor is maintained as shown at portion of plot 820. When the Tupdate period ends, the current of the single capacitor is discharged at portion of plot 822 in order for the charge amount 804 of graph 800 of FIG. 8A to immediately be directed to the zero level. As shown in graph 814 of FIG. 8B, similar charging, holding, and discharging of the current for the single capacitor are also done to generate the charge amounts 808 and 812 of graph 800 of FIG. 8A. As shown in FIG. 8B, the difficulty with the single capacitor for proportional signal path is that it is difficult for a single capacitor to immediately charge and discharge the current in time from one Tupdate period to another Tupdate period.

Figure 8C:
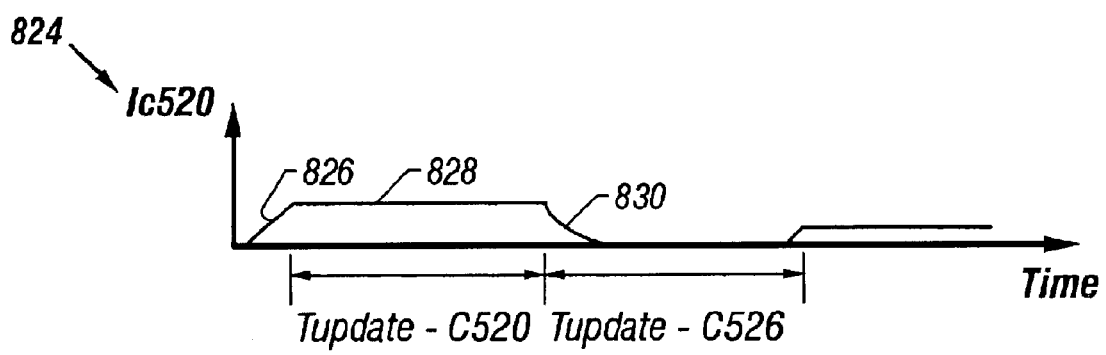
FIG. 8C is an exemplary timing graph showing the charging and discharging of current for one capacitor of the dual-capacitance proportional signal path in the loop filter system of FIG. 4 according to the present invention.
Figure 8D:
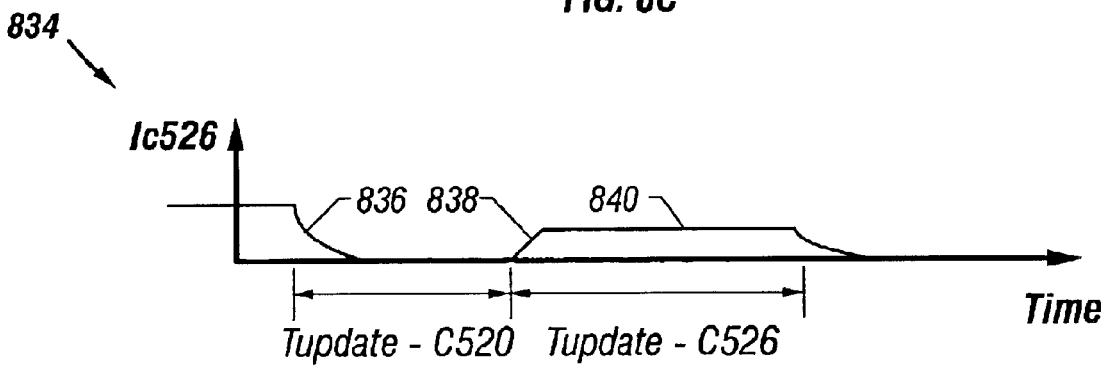
FIG. 8D is an exemplary timing graph showing the charging and discharging of current for another capacitor of the dual-capacitance proportional signal path in the loop filter system of FIG. 4 according to the present invention.

Therefore, a dual-capacitance proportional signal path 500 having capacitors 520 and 526 is utilized instead of a proportional signal path with only a single capacitor. Capacitors 520 and 526 are utilized by alternately charging and discharging them during respective Tupdate periods. With reference now to FIG. 8C, an exemplary timing graph 824 depicting the charging and discharging of current IC520 for capacitor 520 of the dual capacitance proportional signal path 500 of FIG. 4 is shown plotted against Time. Also, referring to FIG. 8D, an exemplary timing graph 834 illustrating the charging and discharging of current Ic526 for capacitor 526 of the dual capacitance proportional signal path 500 of FIG. 4 is shown graphed against Time.

In graph 824 of FIG. 8C, capacitor 520 is initially charged as shown in portion of plot 826, and the charge of capacitor 520 is held at plot portion 828 for the update period for capacitor 520 ("Tupdate—C520"). The charging of capacitor 520 to plot portion 828 generates the charge amount 804 for current Icp shown in graph 800 of FIG. 8A. During the same Tupdate—C520, current c526 of capacitor 526 is reset by discharging as shown at plot portion 836 of graph 834 in FIG. 8D. During Tupdate—C520, capacitor 520 is utilized at this time while capacitor 526 is not utilized. After the end of Tupdate—C520 and during the update period for capacitor 526 ("Tupdate-C526"), capacitor 526 is switched to being utilized, and capacitor 520 is no longer utilized. As shown in graph 834 of FIG. 8D, capacitor 526 is charged at plot portion 838, and the charge of capacitor 526 is held at plot portion 840 for Tupdate—C526. The charging of capacitor 526 to area 840 generates the charge amount 808 for current Icp shown in graph 800 of FIG. 8A. During the same Tupdate—C526, capacitor current c520 of capacitor 520 is reset by discharging as shown at plot portion 830 of graph 824 in FIG. 8C. The charging and discharging and alternating use of capacitors 520 and 526 is able to continue for various Tupdate periods.

Figure 9:
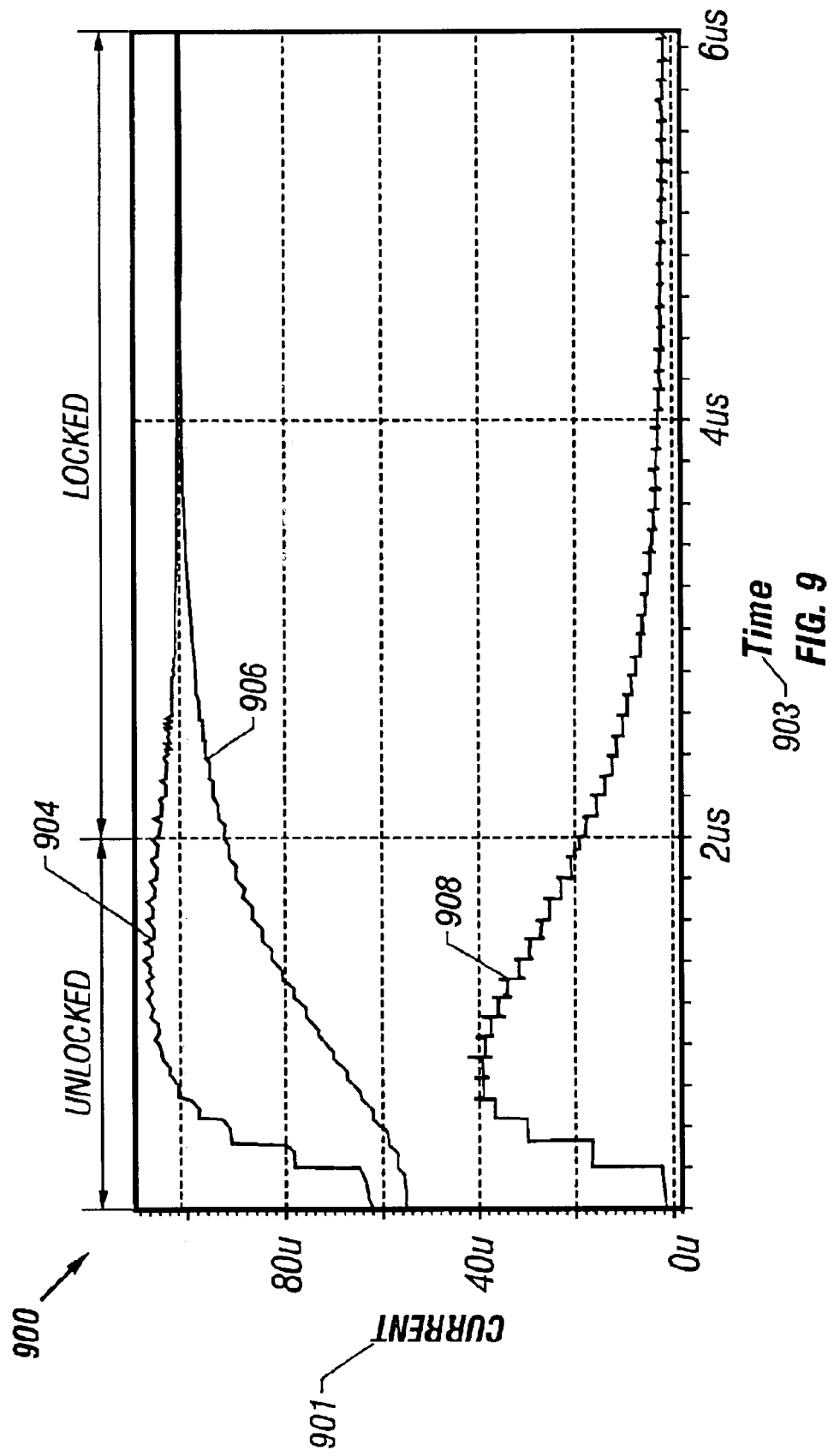
FIG. 9 is an exemplary graph illustrating the input current to the current-controlled oscillator from the loop filter system of FIG. 4 according to the present invention.

With reference now to FIG. 9, an exemplary graph 900 illustrating the input current to ICO 416 from loop filter system 405 according to the present invention is illustrated. In exemplary graph 900, ICO input current 901 is plotted against Time 903. Exemplary graph 900 shows integral path current 906 plotted against time 903. Integral path current 906 has very little jitter as shown in FIG. 9. Exemplary graph 900 further shows proportional path current 908 and the total ICO input current 904 having waveforms with very little jitter due to the charge amounts 804, 808, and 812 being spread over the Tupdate periods as shown in FIG. 8A. The jitter has been reduced in both the unlocked and locked periods of PLL circuit 400. As shown in FIG. 9, current amounts 804, 808, and 812 therefore substantially improve the overall jitter performance of PLL circuit 400.

The present invention discloses a loop filter device and method for a phase locked loop ("PLL") circuit, which locks a frequency of a signal to a reference frequency. The loop filter includes a proportional path circuit and an integral path circuit. The proportional path circuit receives a charge pump output and determines and holds a charge to be directed to or taken from the PLL circuit throughout an update period based on a detected phase difference for the update period for locking a frequency of a signal for the PLL circuit to a reference frequency. The integral path circuit is coupled to the proportional path circuit, and the integral path circuit receives another charge pump output and tracks a total charge level for the PLL circuit based on phase differences for present and prior update periods. The present invention reduces the jitter of a PLL circuit. The present invention also eliminates the effects of current pulses generated by the proportional path of a PLL loop filter. The present invention further does not compromise loop phase margin for a PLL circuit. The present invention also maintains stability for a PLL circuit.

The PLL circuit and method according to the present invention have been described in this specification in terms of a loop filter and a controlled oscillator handling current signals (e.g., current mode). The present invention is not in any way limited to being implemented or operated in a current mode. The present invention may also be described, implemented, and operated in terms of a voltage mode in which the PLL circuit and method utilize a loop filter and controlled oscillator handling voltage signals (e.g., voltage mode).

While the invention has been particularly shown and described with reference to a preferred embodiment, it will be understood by those skilled in the art that various changes in form and detail may be made therein without departing from the spirit and scope of the invention.

What is claimed is:

1. A loop filter for a phase locked loop ("PLL") circuit which locks a frequency of a signal to a reference frequency, comprising:
   a proportional path circuit which receives a charge pump output and determines and holds a charge to be directed to or taken from a PLL circuit throughout an update period based on a detected phase difference for the update period for locking a frequency of a signal for the PLL circuit to a reference frequency and wherein the proportional path circuit provides an independent proportional path output; and
   an integral path circuit that is separate and independent from the proportional path circuit wherein the integral path circuit receives another charge pump output and tracks a total charge level for the PLL circuit based on phase differences for present and prior update periods and wherein the integral path circuit provides an independent integral path output; and
   a summer that receives and sums the independent proportional path output and the independent integral path output to provide a low-jitter loon filter output.

2. The loop filter according to claim 1, wherein the proportional path circuit further comprises:
   a transconductance stage which receives as an input the charge pump output, for converting a voltage signal based on the signal to a current signal;
   a capacitor that is able to couple to the charge pump output or to a reset voltage level wherein the capacitor is respectively able to be charged to hold the charge and to be reset by discharging to the reset voltage level; and
   another capacitor that is able to couple to the charge pump output or to the reset voltage level wherein the another capacitor is also respectively able to be charged to hold the charge and to be reset by discharging to the reset voltage level.

3. The loop filter according to claim 2, wherein the proportional path circuit further comprises:
   a hold switch activated to couple the capacitor to the one charge pump;
   a reset switch activated to couple the capacitor to a reset voltage source to set the capacitor to the reset voltage level;

another hold switch activated to couple the another capacitor to the one charge pump; and another reset switch activated to couple the another capacitor to the reset voltage source to set the another capacitor to the reset voltage level.

4. The loop filter according to claim 3, wherein the detected phase difference is detected by a phase frequency detector and wherein the phase frequency detector controls activation and deactivation of the hold switch, the reset switch, the another hold switch, and the another reset switch to charge, hold, and reset the capacitor and the another capacitor at appropriate times.

5. The loop filter according to claim 1, wherein the integral path circuit further comprises a loop filter stage.

6. The loop filter according to claim 5, wherein the loop filter stage further comprises a capacitor, a transistor, and a resistor wherein the capacitor is coupled between a gate of the transistor and ground, the resistor is coupled between a source of the transistor and ground, and a drain of the transistor is coupled to the summer and wherein the gate of the transistor receives the another charge pump output.

7. A loop filter for a phase locked loop ("PLL") circuit which locks a frequency of a signal to a reference frequency, comprising:

proportional path circuit for generating a proportional output signal based on a detected instantaneous phase difference for locking a frequency of a signal for the PLL circuit to a reference frequency; and the proportional path circuit which receives a charge pump output and determines and holds a charge to be directed to or taken from a PLL circuit throughout an update period based on a detected phase difference for the update period for locking a frequency of a signal for the PLL circuit to a reference frequency and wherein the proportional path circuit provides an independent proportional path output, and an integral path circuit that is separate and independent from the proportional path circuit wherein the integral path circuit generates an integral path output that tracks an overall input signal level including prior proportional output signals generated by the proportional path circuit; and a summer that receives and sums the proportional path output and the integral path output to provide a low-jitter loop filter output to a vco.

8. The loop filter according to claim 7, wherein the proportional path circuit further comprises:

a transconductance stage, which receives as an input a charge pump output, for converting a voltage signal based on the signal to a current signal;

a capacitor that is able to couple to the charge pump output or to a reset voltage level wherein the capacitor is respectively able to be charged to hold the charge and to be reset by discharging to the reset voltage level; and another capacitor that is able to couple to the charge pump output or to the reset voltage level wherein the another capacitor is also respectively able to be charged to hold the charge and to be reset by discharging to the reset voltage level.

9. The loop filter according to claim 7, wherein the integral path circuit further comprises a loop filter stage.

10. The loop filter according to claim 9, wherein the loon filter stage further comprises a capacitor, a transistor, and a resistor wherein the capacitor is coupled between a gate of the transistor and ground, the resistor is coupled between a source of the transistor and ground, and a drain of the transistor is coupled to the summer and wherein the gate of the transistor receives a charge pump output.

11. A method of implementing a loop filter for a phase locked loop ("PLL") circuit which locks a frequency of a signal to a reference frequency, comprising:

separating a proportional path circuit from an integral path circuit so that the proportional path circuit and the integral path circuit are independent from each other wherein, the proportional path circuit which receives a charge pump output and determines and holds a charge to be directed to or taken from a PLL circuit throughout an update period based on a detected phase difference for the update period for locking a frequency of a signal for the PLL circuit to a reference frequency and wherein the proportional path circuit provides an independent proportional path output; and wherein, the integral path circuit receives another charge pump output;

generating, by the proportional path circuit, a proportional output signal based on a detected instantaneous phase difference for locking a frequency of a signal for the PLL circuit to a reference frequency; and generating, by the integral path circuit, an integral path output that tracks an overall input signal level including prior proportional output signals generated by the proportional path circuit; and summing, by a summer, the proportional path output and the integral path output to provide a low-jitter loop filter output.

12. The method according to claim 11, wherein generating, by the proportional path circuit, a proportional output signal further comprises:

receiving, by a transconductance stage, as an input a charge pump output for converting a voltage signal based on the signal to a current signal;

coupling a capacitor to the charge pump output or to a reset voltage level wherein the capacitor is respectively able to be charged to hold the charge and to be reset by discharging to the reset voltage level; and coupling another capacitor to the charge pump output or to the reset voltage level wherein the another capacitor is also respectively able to be charged to hold the charge and to be reset by discharging to the reset voltage level.

13. The method according to claim 11, wherein the integral path circuit further comprises a loop filter stage.

14. The method according to claim 13, wherein the loop filter stage further comprises a capacitor, a transistor, and a resistor and the capacitor is coupled between a gate of the transistor and ground, the resistor is coupled between a source of the transistor and, ground, and a drain of the transistor is coupled to an input of the summer; and wherein generating, by the integral path circuit, an integral path output further comprises:

recieving a charge pump output through the gate of the transistor and providing the integral path output through the drain of the transistor.

* * * * *